United States Patent
Forman et al.

(10) Patent No.: US 8,120,173 B2
(45) Date of Patent: Feb. 21, 2012

(54) THIN EMBEDDED ACTIVE IC CIRCUIT INTEGRATION TECHNIQUES FOR FLEXIBLE AND RIGID CIRCUITS

(75) Inventors: Glenn Alan Forman, Niskayuna, NY (US); Kelvin Ma, Clifton Park, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 262 days.

(21) Appl. No.: 11/121,236

(22) Filed: May 3, 2005

(65) Prior Publication Data
US 2006/0249754 A1  Nov. 9, 2006

(51) Int. Cl.
*H01L 23/34* (2006.01)
(52) U.S. Cl. ......... 257/723; 361/760; 361/761; 174/260
(58) Field of Classification Search .................. 257/723; 361/760, 761; 174/260
See application file for complete search history.

(56) References Cited

U.S. PATENT DOCUMENTS

| | | | |
|---|---|---|---|
| 5,567,657 A * | 10/1996 | Wojnarowski et al. | 438/109 |
| 6,159,767 A * | 12/2000 | Eichelberger | 438/107 |
| 6,849,945 B2 * | 2/2005 | Horiuchi et al. | 257/735 |
| 2006/0126313 A1 * | 6/2006 | Steiner et al. | 361/760 |

FOREIGN PATENT DOCUMENTS

JP  410013036  *  1/1998

* cited by examiner

*Primary Examiner* — Samuel Gebremariam
(74) *Attorney, Agent, or Firm* — Howard IP Law Group

(57) ABSTRACT

A flexible electronic circuit member formed of a plurality of dielectric layers includes a plurality of thinned semiconductor chips embedded within the circuit member for increased levels of integration and component density. The thinned semiconductor chips may include various integrated circuits thereon. They may be formed on various substrates and using various technologies and the embedded, thinned semiconductor chips are interconnected by a patterned interconnect that extends between and through the respective dielectric layers. A method for forming the flexible circuit member includes joining conventional semiconductor chips to a mounting apparatus then grinding the semiconductor chips to form thinned semiconductor chips that are joined to respective dielectric layers that combine to form the flexible electronic circuit member. A releasable bonding layer is used to join the semiconductor chip to a mounting assembly during the grinding operation and removed after the thinned semiconductor chips are joined to the respective dielectric layers used in combination to form the electronic circuit member.

25 Claims, 2 Drawing Sheets

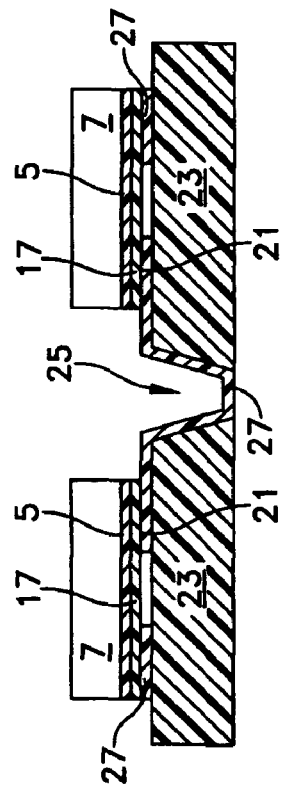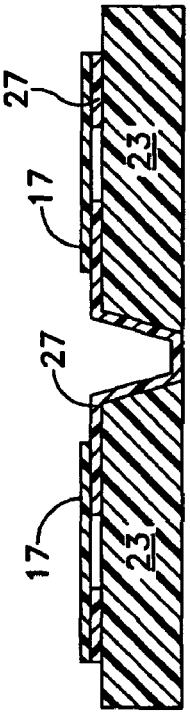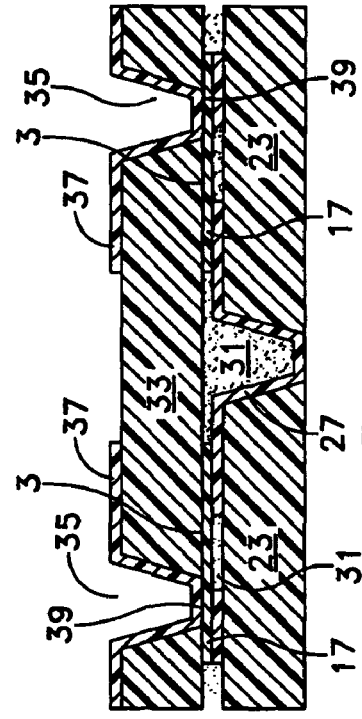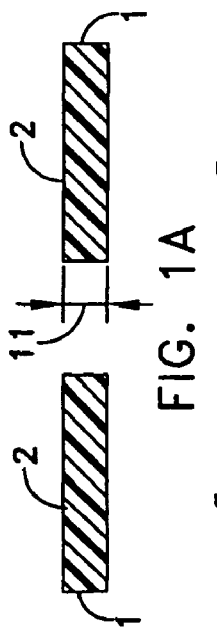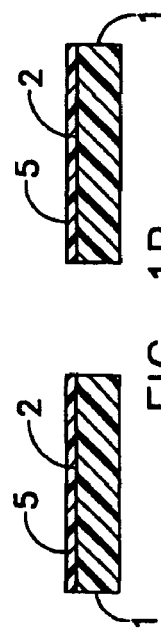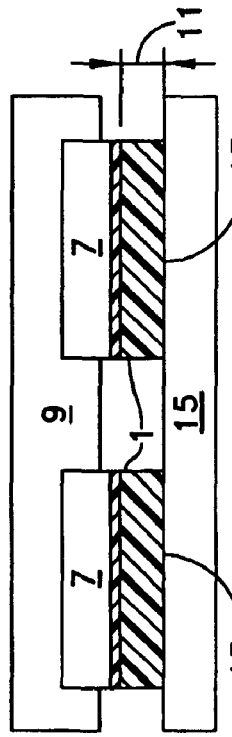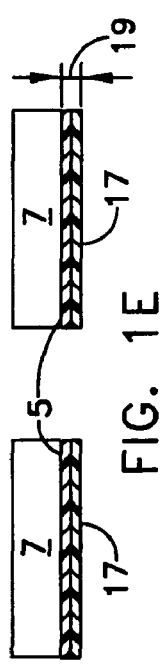

THIN EMBEDDED ACTIVE IC CIRCUIT INTEGRATION TECHNIQUES FOR FLEXIBLE AND RIGID CIRCUITS

FIELD OF THE INVENTION

The present invention is directed to embedding active IC electronic, optical or optoelectronic circuits and, more particularly, to flexible and rigid electronic circuits and methods for making the same.

BACKGROUND

Circuit boards are used extensively and in various applications throughout the electronics industry that permeates today's technologically advancing world. Advances in the electronics industry generally parallel increased levels of integration of the individual electronic components such as integrated circuits, and the assemblies, subassemblies and packages such as circuit boards or other multi-component circuit members. A circuit board generally includes a plurality of various components and networks that host signal pathways whose characteristic mode or transmission may require either or both guided media (copper electrical trace, glass or polymer optical waveguide) and unguided media (radio frequency (Rf) antenna, free-space optical (FSO) or other electromagnetic signaling, magnetic coupling, or transformer). Most prominent and important among the components are integrated circuit (IC) chips also known simply as chips that contain many forms of circuits and various methods for signal pathways. Integrated circuits chips consist of an array of integrated circuits formed on a semiconductor wafer and are then singulated into individual die and thus also are referred to as semiconductor chips. Such ICs contain lithographically patterned transistors, interconnections, passive components (inductor, resistor, capacitor, etc.,) and are monolithic in structure and may involve electrical, optical, optoelectronic, or passive functions and interconnections. The degree of integration of a circuit board is determined by the number of integrated circuit chips packaged and placed with other thermal, mechanical and connector components that the network of a circuit board accommodates.

Conventional circuit board and/or flex circuit designs allow only for the placement of IC chips on opposed sides of the board. This limits the component density achievable per unit area of the circuit board. As the electronics industry continues to evolve, higher component densities in smaller spaces are needed to address the demand for higher performance networks and more portable applications. In order to achieve a higher density of components and interconnections per unit area, various approaches have been taken but are still limited to providing active circuit elements such as integrated circuit chips, on the opposed surfaces of the circuit board or other circuit member. For example, the stacking of bare ICs or the use of multi-chip module (MCM) packaging was developed as a packaging solution to directly integrate at the chip level. Another approach to chip density packaging is wafer scaled integration to directly integrate active circuits at the wafer level. The wafer scaled integration is further limited as it can only integrate IC chips formed of the same technology. Other approaches such as developing three dimensional chip stacking techniques have been undertaken, however, chip stacking techniques tend to limit the electrical interconnects between IC and thermal dissipation and further that input/output (I/O) signal pathways through or around the perimeter of the IC inhibit achieving higher density circuitry or networks. Flexible circuit boards are known and can advantageously adapt to various configurations, but their flexibility is limited by the flexibility of the components formed on the circuit boards and the flexibility and durability of the interconnects that couple the circuit components. Flexible circuit boards have similarly limited component densities, as above.

It would therefore be advantageous to further increase component per unit area density and therefore integration levels of a circuit board or other circuit member, by embedding integrated circuit chips within such an electronic circuit member, and additionally advantageous to do so with a flexible circuit board.

SUMMARY OF THE INVENTION

To address these and other objects and in view of its purposes, the present invention provides a multi-component circuit member having a plurality of layers and a plurality of semiconductor chips, at least one of the semiconductor chips embedded between layers of the plurality of layers.

The present invention also provides a circuit device comprising a electronic, optical or optoelectronic circuit member including a plurality of semiconductor chips, at least one of the semiconductor chips being an embedded semiconductor chip embedded within the flexible circuit member. The circuit member may be flexible and it may be formed of a plurality dielectric layers with each embedded semiconductor chip embedded between adjacent dielectric layers.

The present invention also provides a semiconductor chip for internal integration within a flexible circuit member formed of a plurality of layers, the semiconductor chip comprising a flexible semiconductor substrate with an integrated circuit formed thereon and having a sufficiently small thickness to be flexible.

In another embodiment, the present invention provides a method for forming an electronic, optical or optoelectronic circuit member. The method includes providing a plurality of semiconductor chips, each including an integrated circuit formed thereon. The method further includes forming a releasable bond layer over each of the semiconductor chips, coupling an associated die mount to each of the semiconductor chips through the associated releasable bond layer, grinding each of the semiconductor chips to reduce their thicknesses, thereby forming a corresponding plurality of reduced thickness semiconductor chips. At least one of the reduced thickness semiconductor chips is joined to a first dielectric layer and the associated releasable bond layer and die mount are removed from each of the reduced thickness semiconductor chips. The method further provides for forming at least a second dielectric layer over the first dielectric layer and over the reduced thickness semiconductor chip or chips to form an electronic, optical or optoelectronic circuit member that may be a flexible circuit board.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included in the drawing are the following figures.

FIG. 1A-1H are cross-sectional views representing a sequence of operations used to form a circuit board with embedded thinned IC chips according to the present invention;

DETAILED DESCRIPTION

Figure 2:
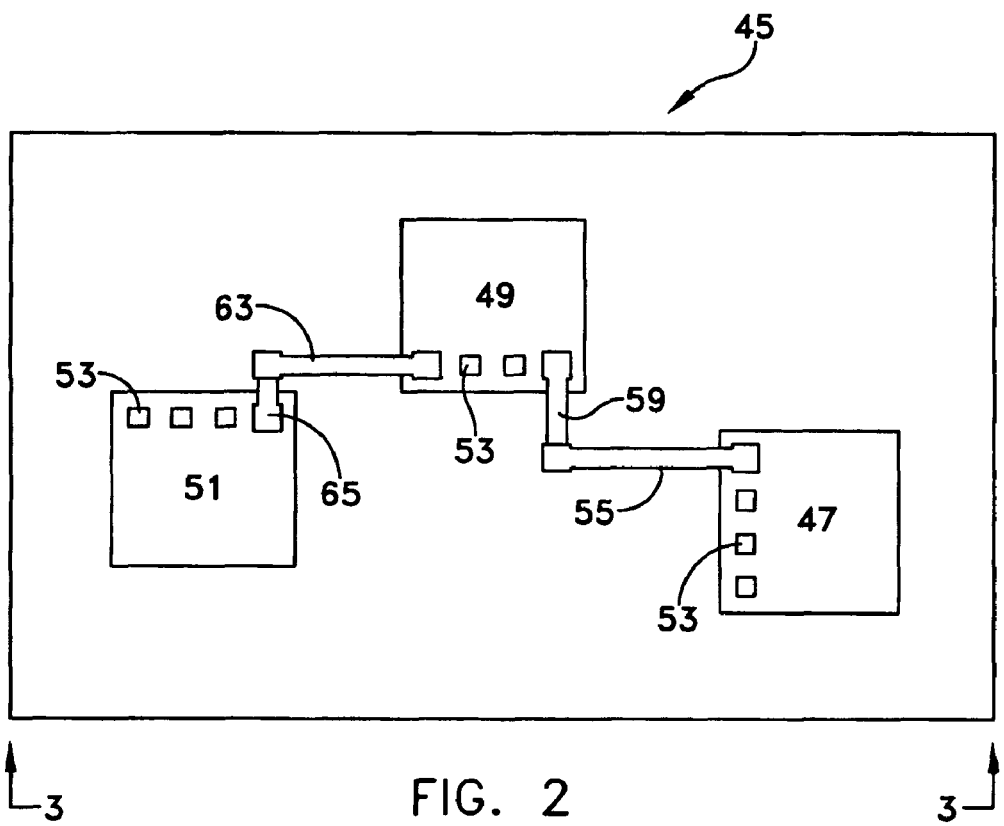
FIG. 2 is a plan view of a portion of an exemplary circuit board including embedded IC chips according to the present invention.

The present invention provides for thinning semiconductor chips to a minimal thickness and the process of handling the thinned die that enables the thin semiconductor chips to be embedded between layers of a multi-layer electronic circuit such as a circuit board. The thinned semiconductor chips are arranged in a three-dimensional spatial relationship and disposed on multiple layers on the multi-layer circuit member. The thinned semiconductor chips may be interconnected to other thinned semiconductor chips on the same, or on other layers of the multi-layer circuit member. The number of interconnect layers may advantageously be minimized and the semiconductor chips sufficiently thinned to provide flexibility for the entire circuit member, enabling the circuit member to conform to non-planar orientations. The flexibility enables the circuit member to adopt various shapes and fit in confined areas and further allows alignment of signal pathways with corresponding electrical, optical or optoelectronic interfaces and interconnections for both guided and unguided media. The thinning of the structure removes parasitic or attenuating bulk and provides faster or higher signal integrity for the signal pathways.

The invention provides for furnishing a plurality of semiconductor chips and processing the chips to form a multi-layer circuit member, or board, as illustrated in the process sequence shown in FIGS. 1A-1H. The multi layer circuit member may include multiple components and advantageously be flexible. FIG. 1A shows two semiconductor chips 1. Semiconductor chips 1 include active surface 2 upon which an integrated circuit or other semiconductor device is formed and may alternatively be referred to as integrated circuit, IC, chips when they include an integrated circuit formed on active surface 2. Semiconductor (including for example, amorphous semiconductor) chips 1 may be formed on various substrates such as silicon or gallium arsenide, and according to various technologies. In an exemplary embodiment, the two semiconductor chips 1 may be formed using different technologies and will be integrated into the same layer of a circuit member as will be shown in subsequent figures. Semiconductor chips 1 may include various thicknesses 11 as commonly used in the semiconductor manufacturing industry. Thickness 11 represents the thickness of the semiconductor chip 1 after it is formed from a conventional semiconductor substrate and may be achieved after some degree of polishing is carried out upon the original semiconductor substrate.

Now turning to FIG. 1B, releasable bonding material layer 5 is formed over active surface 2 of semiconductor chip 1. Releasable bonding material layer 5 may be a blanket layer of insulating polymer or silicon dioxide or another dielectric formed on semiconductor chip 1 using conventional deposition methods. In one embodiment, releasable bonding material layer 5 may be a dissolvable and/or etchable adhesive layer. Any suitable layer that does not damage or attack active surface 2, and is easily removable or releasable from active surface 2 using techniques that do not damage or attack active surface 2, may be used. FIG. 1C shows die mount 7 formed over releasable bonding material layer 5. Die mount 7 is thereby coupled to the corresponding semiconductor chip 1 through releasable bonding material layer 5. Die mount 7 is generally chosen to be roughly the size of semiconductor chip 1 and in the exemplary embodiment, each die mount 7 is the same size as the semiconductor chip 1 to which it is bonded. Semiconductor chips 1 are adapted for polishing as die mounts 7 are coupled to mounting substrate 9 as shown in FIG. 1D. The entire assembly of multiple die mounts 7 and mounting substrate 9, including semiconductor chips 1, is then processed in a polishing tool such that grinding surface 15 grinds semiconductor chips 1 to a lesser thickness than starting thickness 11. The grinding operation may include grinding, lapping and polishing procedures to thin semiconductor chips 1. The grinding/lapping/polishing procedure is continued until a suitably thin final thickness is achieved to produce reduced thickness semiconductor chips 17 as shown in FIG. 1E. In an exemplary embodiment, final thickness 19 may be on the order of a few one thousandths of an inch (i.e a few mils), and chosen to be sufficiently thin to provide flexibility to the reduced thickness semiconductor chips 17. In an exemplary embodiment, final thickness 19 may range from submicron to several mils (e.g. about 2-3 mils).

Still joined to releasable bonding material layer 5 and die mounts 7, reduced thickness semiconductor chips 17 are adapted for placement onto the dielectric layers that combine to form the circuit member or board. Testing or burn-in may be advantageous at various points in the range of process stages. Dielectric layer 23 may be flexible dielectric layer such as Kapton™ or polyimide, or a rigid dielectric layer such as glass-epoxy in circuit boards known generally as FR4 (Fire-Retardant 4). In an exemplary embodiment, dielectric layer 23 may include a thickness ranging from submicron to several mils. More particularly, as shown in FIG. 1F, reduced thickness semiconductor chips 17 are joined to patterned interconnect layer 27 formed on dielectric layer 23. Via 25 extends through dielectric layer 23. Patterned interconnect layer 27 may be formed using various suitable conventional processing techniques and may extend into vias such as via 25 to provide contact to a subjacent component (not shown in FIG. 1F). A single or various non-conductive (unguided media), microlens, waveguiding (guided optical media) or conductive (electrically conductive)) via, solder bump or embedded particle materials may be used to form signal paths by unpatterned or patterned interconnect layer 27 and conventional lithographic and etching techniques may be used to pattern patterned interconnect layer 27 on dielectric layer 23. Reduced thickness semiconductor chips 17 are accurately positioned and coupled to dielectric layer 23 such that backsides 21 of respective semiconductor chips 17 are directly coupled to patterned interconnect layer 27 which may provide enhanced thermal or signal integrity in the form of a ground shield or signal shield, and they also may provide backside bias to the reduced thickness semiconductor chip 17. Signal coupling or alignment may be actively or passively assured during this step. Patterned interconnect layer 27 may alternatively or additionally provide signal media or thermal management (i.e., act as a heat sink) for reduced thickness semiconductor chips 17 that are joined to it. After reduced thickness semiconductor chips 17 are joined to dielectric layer 23, releasable bonding material layer 5 is removed, separating reduced thickness semiconductor chip 17 from corresponding die mounts 7 to form the structure shown in FIG. 1G. Additional dielectric layers can be added to the structure shown in FIG. 1G over dielectric layer 23 and over the top of reduced thickness semiconductor chips 17 to directly embed reduced thickness semiconductor chip 17 between the respective dielectric layers. Such additional dielectric layers may be added to the sides of the chip and may be micro-structured or patterned with electrical interconnect and optical waveguides, micro-lenses or other interconnections required by the electrical, optical or optoelectronic chip I/O network. An exemplary further dielectric layer is shown in FIG. 1H.

FIG. 1H shows superjacent dielectric layer 33 joined to dielectric layer 23 and other reduced thickness semiconductor chip 17 by means of flexible adhesive 31. Superjacent dielectric layer 33 may be the same or different than dielectric layer 23 and may have a thickness ranging from submicron to several mils. Various suitable adhesives capable of joining the dielectric layers together to form the multi-layer electronic, optical or optoelectronic circuit member, may be used as flexible adhesive 31. A further patterned interconnect layer 37 may be formed on superjacent dielectric layer 33 using conventional conductive materials and according to conventional methods. Patterned interconnect layer 37 may extend within vias 35 that extend through superjacent dielectric layer 33 and provide contact 39 to a contact such as a signal coupling or bonding pad formed on an integrated circuit disposed on active surface 2 of semiconductor chip 1. A further reduced thickness semiconductor chip 17 or chips (not shown) may then be disposed over superjacent dielectric layer 33 and coupled to further patterned interconnect layer 37. Additional dielectric layers may be formed over superjacent dielectric layer 33 and additional reduced thickness semiconductor chips 17 formed thereon to continue the sequence of embedding reduced thickness semiconductor chips between dielectric layers that combine to form a circuit member which may advantageously be a flexible circuit board. The patterned interconnect layers such as patterned interconnect layers 27 and 37 provide for disposing the semiconductor chips in three-dimensional spatial relationship with respect to each other such as shown in FIGS. 2 and 3.

FIG. 2 shows an exemplary portion of a circuit member 45 according to the present invention. FIG. 3 is a cross-sectional view taken along line 3-3 of FIG. 2. With reference to FIGS. 2 and 3, circuit member 45 is advantageously a flexible electronic circuit such as a circuit board and includes a plurality of discrete semiconductor chips including semiconductor chips 47, 49, and 51 formed respectively on first dielectric layer 69, second dielectric layer 71 and third dielectric layer 73 of circuit board 45. Each of semiconductor chips 47, 49, and 51 include bond pads 53 formed on respective active surfaces of the semiconductor chips that also include an integrated circuit or other semiconductor device formed thereon. Semiconductor chip 47 is electrically coupled to semiconductor chip 49 by means of interconnects 55 and 59 formed on first dielectric layer 69 and second dielectric layer 71, respectively, and extending through vias formed through the respective layers to provide contact. An analogous signal pathway connection for guided or unguided media may be provided in this scheme as dictated by the chip I/O characteristics. Such structures include those suitable to host signal pathways that may require both guided media (copper electrical trace, glass or polymer optical waveguide) and unguided media (radio frequency (Rf) antenna, free-space optical (FSO) or other electromagnetic signaling, magnetic coupling, or transformer). Via 77 is such an exemplary via as shown in FIG. 3. Each of semiconductor chips 47, 49, and 51 are reduced thickness semiconductor chips embedded between dielectric layers that combine to form circuit member 45. Similarly, semiconductor chip 49 is electrically coupled to semiconductor chip 51 by means of interconnects 63 and 65 formed over and extending through second dielectric layer 71 and third dielectric layer 73, respectively. Any or all of semiconductor chips 47, 49, and 51 may also be coupled to a subjacent conductive interconnect layer (not shown) that may provide contact to other semiconductor chips, further circuit components, or ground or a source of bias control to maintain the backsides of the semiconductor chips at a desired bias level. In another embodiment (not shown), the subjacent conductive layer may act as a heat sink for thermal management, or may contain microlens or other optical waveguide structures or magnetic coupling transformers, consistent with guided and unguided signal pathways to satisfy signal pathways by both guided and unguided optical or microlens media, where signal coupling extends through dielectric layer(s) or interconnecting via, or through Rf signal antenna, or by magnetic coupling between chips.

Figure 3:
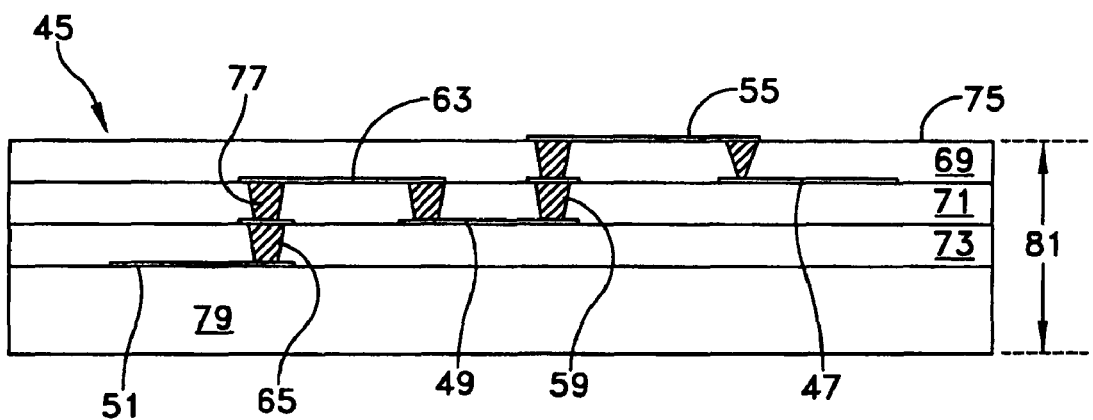
FIG. 3 is a cross-sectional view taken along line 3-3 of FIG. 2.

An advantage of the present invention is that respective semiconductor chips 47, 49, and 51, similar to semiconductor chips 1 shown in FIGS. 1A-AH, may be formed on different substrates and using different technologies thereby increasing integration levels and versatility of circuit member 45 shown in FIGS. 2 and 3. Another advantageous aspect of the present invention is that the reduced thickness semiconductor chips may be reduced to a thickness sufficiently thin and the number of dielectric layers and composition of the dielectric layers may be chosen to provide that the formed structure of electronic circuit member 45 which may be a circuit board, may be flexible and may conform to various shapes when installed. The reduced thickness semiconductor chips may be thinned to a point where they are somewhat flexible and do not fracture when the circuit board or other circuit member is vibrated, shocked or bent. This enables the circuit member to fit within confined volumes of space thereby increasing the applications for which the flexible circuit member may be used. The flexible circuit member may be installed within various apparatuses in a non-planar orientation.

Bulk portion 79 of circuit members 45 may be a base substrate formed of various suitable substrate materials or it may represent one or more further dielectric layers such as dielectric layers 69, 71 and 73. Bulk portion 79 and thickness 81, which may range from submicron to several mils, may be chosen to ensure flexibility of circuit member 45, which, in another embodiment, may be rigid.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures. Terms concerning signal pathway such as "signal coupling", "guided and unguided media" refer to a relationship of the novel structure with the interconnections that are advantageous to improved signal integrity, miniature size, low weight or reduced manufacturing cost either directly or indirectly by these configurations.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A circuit device comprising an electronic, optical or optoelectronic circuit member including:
   a first semiconductor chip embedded between and in contact with a first dielectric material layer and a second dielectric material layer, said first semiconductor chip having a first side that directly joins to a patterned interconnect layer that extends into a via that is formed in said first dielectric material layer, said first semiconductor chip having a second side that directly joins to a second patterned interconnect layer that extends into a via that is formed in said second dielectric material layer, and
   a second semiconductor chip embedded between and in contact with said second dielectric material layer and a third dielectric material layer disposed below the second dielectric material layer, said second semiconductor chip having a first side that directly joins to said second patterned interconnect layer that extends into said via that is formed in said second dielectric material layer.

2. The circuit device as in claim 1, wherein said electronic circuit member is flexible.

3. The circuit device as in claim 2, wherein said electronic circuit member comprises a flexible circuit board.

4. The circuit device as in claim 1, wherein said electronic, optical or optoelectronic circuit member comprises at least three embedded semiconductor chips, wherein each said chip is embedded between adjacent stacked dielectric material layers.

5. The circuit device as in claim 4, wherein at least one of said stacked dielectric material layers is formed of polyimide.

6. The circuit device as in claim 4, wherein said electronic, optical or optoelectronic circuit member is flexible and further comprising said dielectric material layers formed on a flexible base substrate.

7. The circuit device as in claim 4, wherein said electronic, optical or optoelectronic circuit member is flexible and further comprising metalized interconnects interconnecting said at least three semiconductor chips and extending along said dielectric material layers and through said vias in said dielectric material layers.

8. The circuit device as in claim 4, wherein said electronic, optical or optoelectronic circuit member is flexible and said at least one embedded semiconductor chip couples to another embedded semiconductor chip through conductive interconnects formed on and extending through one or more dielectric material layers of said plurality of stacked dielectric material layers.

9. The circuit device as in claim 4, wherein said electronic, optical or optoelectronic circuit member is flexible and at least one of said at least three semiconductor chips is disposed on patterned metal formed directly on one of said dielectric material layers.

10. The circuit device as in claim 9, wherein said patterned metal is connected to one of ground or a source of bias control.

11. The circuit device as in claim 9, wherein said patterned metal is a heat sink.

12. A circuit member comprising:
    a plurality of stacked dielectric layers;
    a plurality of semiconductor chips each embedded between and in contact with two of said stacked dielectric layers;
    a first one of said semiconductor chips, embedded between and in contact with a first one of said stacked dielectric layers and a second one of said stacked dielectric layers arranged below said first stacked dielectric layer, said first semiconductor chip having a first side that directly connects to a first interconnect layer that extends into a via that is formed in said first stacked dielectric layer; and
    a second one of said semiconductor chips embedded between and in contact with said first stacked dielectric layer and a third one of said stacked dielectric layers arranged above said first stacked dielectric layer, wherein said second semiconductor chip is directly connected to said first semiconductor chip through said first interconnect layer.

13. The circuit member of claim 12, wherein said circuit member is flexible.

14. The circuit member of claim 13, wherein said circuit member comprises a flexible circuit board.

15. The circuit member of claim 12, wherein said circuit member comprises at least three semiconductor chips and at least two interconnect layers that extend into two or more vias that are formed in said stacked dielectric layers.

16. The circuit member of claim 15, wherein at least one of said stacked dielectric layers is formed of polyimide.

17. The circuit member of claim 15, wherein said circuit member is flexible and further comprising a flexible substrate, said stacked dielectric layers being formed on said flexible substrate.

18. The circuit member of claim 15, wherein said circuit member is flexible and further comprising metalized interconnects interconnecting said at least three semiconductor chips and extending along said stacked dielectric layers and through said vias in said stacked dielectric layers.

19. The circuit member of claim 15, further comprising:
    said first semiconductor chip having a second side that directly joins to a second interconnect layer that extends into a via that is formed in said second stacked dielectric layer;
    wherein said circuit member is flexible;
    wherein at least one of said semiconductor chips couples to at least one other semiconductor chip through conductive interconnects formed on and extending through one or more stacked dielectric layers of said plurality of stacked dielectric layers; and
    wherein the thickness of each of said at least three semiconductor chips is not more than about 3 mils.

20. The circuit member of claim 15, wherein said circuit member is flexible and at least one of said at least three semiconductor chips is disposed on patterned metal formed directly on one of said stacked dielectric layers.

21. The circuit member of claim 20, wherein said patterned metal is connected to one of ground or a source of bias control.

22. The circuit member of claim 20, wherein said patterned metal is a heat sink.

23. A circuit member comprising:
a plurality of stacked dielectric layers;
a plurality of semiconductor chips each embedded between and in contact with two of said stacked dielectric layers;
a first one of said semiconductor chips, embedded between and in contact with a bottom surface of a first one of said stacked dielectric layers and a top surface of a second one of said stacked dielectric layers arranged below said first stacked dielectric layer, said first semiconductor chip having a first side that is directly connected to a first interconnect layer that extends into a via that is formed in said first stacked dielectric layer; and
a second one of said semiconductor chips arranged on a top surface of said first one of said stacked dielectric layers, wherein said second semiconductor chip is directly connected to said first semiconductor chip through said first interconnect layer.

24. The circuit member of claim 23, wherein a portion of said first interconnect layer forms said via, and said first side of said first semiconductor chip is directly connected to said portion of said first interconnect layer forming said via.

25. The circuit member of claim 23, wherein said first semiconductor chip includes an integrated circuit arranged on said first side thereof, said integrated circuit directly connected to said first interconnect layer.

* * * * *